(12) United States Patent
Chiou et al.

(10) Patent No.: US 7,416,648 B2
(45) Date of Patent: Aug. 26, 2008

(54) IMAGE SENSOR SYSTEM FOR MONITORING CONDITION OF ELECTRODE FOR ELECTROCHEMICAL PROCESS TOOLS

(75) Inventors: Wen-Chih Chiou, Miaoli (TW); Ying-Ho Chen, Taipei (TW); Cheng Hsun Chan, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 401 days.

(21) Appl. No.: 11/127,361

(22) Filed: May 12, 2005

(65) Prior Publication Data

US 2006/0254927 A1 Nov. 16, 2006

(51) Int. Cl.
*C25B 9/02* (2006.01)
(52) U.S. Cl. .............. 204/297.08; 204/297.01; 204/297.06; 204/297.07
(58) Field of Classification Search .......... 205/297; 204/297.01, 297.06, 297.07, 297.08
See application file for complete search history.

(56) References Cited

U.S. PATENT DOCUMENTS

| | | | |
|---|---|---|---|
| 6,776,693 B2 | 8/2004 | Duboust et al. | |
| 6,811,680 B2 | 11/2004 | Chen et al. | |
| 6,837,983 B2 | 1/2005 | Duboust et al. | |
| 6,841,057 B2 | 1/2005 | Wadensweiler et al. | |
| 6,848,970 B2 | 2/2005 | Manens et al. | |
| 6,863,794 B2 | 3/2005 | Tsai et al. | |
| 6,863,797 B2 | 3/2005 | Sun et al. | |
| 7,127,098 B2 * | 10/2006 | Shimoda et al. | 382/145 |
| 2001/0039163 A1 * | 11/2001 | Southwick | 451/6 |
| 2002/0130049 A1 * | 9/2002 | Chen et al. | 205/640 |
| 2003/0053676 A1 * | 3/2003 | Shimoda et al. | 382/145 |
| 2003/0121890 A1 * | 7/2003 | Kuo | 216/85 |
| 2004/0178060 A1 * | 9/2004 | Ravkin et al. | 204/232 |
| 2004/0201483 A1 * | 10/2004 | Stam et al. | 340/600 |
| 2005/0173259 A1 * | 8/2005 | Mavliev et al. | 205/645 |
| 2006/0180465 A1 * | 8/2006 | Mavliev et al. | 204/297.1 |

* cited by examiner

*Primary Examiner*—Bruce F Bell
(74) *Attorney, Agent, or Firm*—Slater & Matsil, L.L.P.

(57) ABSTRACT

A system for use in manufacturing semiconductor devices, is provided. The system includes an electrochemical processing tool and an image sensor. The electrochemical processing tool includes an electrode located at a central region of a platen. The electrode is adapted for contacting a wafer workpiece during certain processing of the wafer workpiece using the tool. At least part of the electrode is viewable from above the platen when the electrochemical processing tool is operably assembled. The image sensor is capable of capturing an image of the viewable part of the electrode. The image sensor is positioned above the platen. The image sensor is adapted to be aimed at the electrode when an image of the electrode is to be taken with the image sensor.

20 Claims, 7 Drawing Sheets

IMAGE SENSOR SYSTEM FOR MONITORING CONDITION OF ELECTRODE FOR ELECTROCHEMICAL PROCESS TOOLS

TECHNICAL FIELD

The present invention generally relates to electrochemical processing tools for the manufacturing of integrated circuit chips. More particularly, the present invention relates to providing an image sensor system for monitoring the condition of an electrode for electrochemical processing tools.

BACKGROUND

Every year the microelectronics industry produces faster chips with smaller and smaller devices. The industry is constantly devising new strategies and techniques for manufacturing integrated circuit chips more efficiently and with greater production yield. There is a current push to use low-k dielectric materials as insulators for the multilevel interconnect structures. Low-k dielectric materials reduce RC delay and reduce parasitic capacitances, but low-k dielectric materials are typically weak in strength and prone to cracking, scratching, delamination, and other failure modes. At the same time, copper is currently the metal of choice for providing interconnect lines. In the past, aluminum was often used. Although copper provides better electrical properties than aluminum, copper is more difficult to process. Using conventional chemical mechanical polishing (CMP) for planarizing the work piece works fine for copper, but CMP of copper requires a higher down force on the substrate than other materials, such as aluminum. This exerts large forces on surrounding low-k dielectric materials, which may lead to damage of the low-k dielectric materials and lower yields.

To successfully introduce low-k dielectric materials in combination with copper lines, low down force planarization techniques for copper were needed. This lead to the development and use of electrochemical mechanical polishing (ECMP) tools. Such ECMP tools combine techniques from electropolishing and CMP to provide a low down force planarization technique for copper while maintaining global and local planarity for copper planarization steps.

ECMP removes conductive materials from a substrate surface by electrochemical dissolution while polishing the substrate with a reduced mechanical abrasion compared to conventional CMP processes. The metal ions dissolve into a surrounding electrolyte solution at a rate proportional to the electrical current. The metal ions from the substrate (anode) plate the electrode (cathode), fall out of the solution as a precipitate of complexes, or remain in the solution. The destination of the metal ions depends greatly upon the chemistry of the metals and the solution. Chelating agents, corrosion inhibitors, pH adjusting agents, or combinations thereof may be used in the electrolyte solution to reduce damage to the low-k dielectric material during ECMP processing.

Typically in an ECMP tool, the anode electrode makes physical and electrical contact with the wafer workpiece. Similarly, electrochemical plating (ECP) tools may use the same anode electrode or a similar electrode that makes contact with the wafer. Often an ECMP tool and an ECP tool are combined at a same station or part of a same tool assembly. The surface of the electrode needs to be clean and smooth to provide good contact with the wafer. Poor contact may induce a large IR drop or an open, which will impact process quality significantly. The anode electrode may be scratched, corroded, oxidized, burned, worn out, or combinations thereof, over time from usage. Under current operations using current electrochemical processing tools (e.g., ECP and/or ECMP), the electrode that contacts the wafer is checked visually by a person once per day. However, if the electrode becomes damaged at some point during that day, the production yield for that day may be impacted significantly. Hence, there is a need for a way to monitor the condition of the electrode in an electrochemical processing tool more frequently, but without the need for a person to come to the tool each time.

SUMMARY OF THE INVENTION

The problems and needs outlined above may be addressed by embodiments of the present invention. In accordance with one aspect of the present invention, a system for use in manufacturing semiconductor devices, is provided. The system includes an electrochemical processing tool and an image sensor. The electrochemical processing tool includes an electrode located at a central region of a platen. The electrode is adapted for contacting a wafer workpiece during certain processing of the wafer workpiece using the tool. At least part of the electrode is viewable from above the platen when the electrochemical processing tool is operably assembled. The image sensor is capable of capturing an image of the viewable part of the electrode. The image sensor is positioned above the platen. The image sensor is adapted to be aimed at the electrode when an image of the electrode is to be taken with the image sensor.

The electrochemical processing tool may include an electrochemical mechanical polishing tool, wherein the electrode is an anode electrode having a plurality of conductive members, and wherein the conductive members are adapted to make physical contact with the wafer workpiece when the electrode is used for processing the wafer workpiece. The image sensor may be attached to a movable polishing head, such as a multi-head carousel for example. The image sensor may be attached to a fixed structural frame portion that supports at least part of the tool. The image sensor may include a charged-coupled device (CCD) camera and/or a CMOS camera, for example. The system may further include an image processor system. The image processor system may include software adapted to determine whether an image of the electrode reveals damage to the electrode that exceeds predetermined criteria. The image processor system may include software adapted to compare a latest image of the electrode to certain standards. The image sensor and the image processor may be an integral part of the system included with electrochemical processing tool. The image sensor and the image processor may be part of a stand-alone sensor system operable independent of the electrochemical processing tool. The image sensor may be electrically connected to electronic devices of the electrochemical processing tool and the image sensor may be adapted to feed image signals into the electronic devices of the electrochemical processing tool. The electrochemical processing tool may include an electrochemical plating tool. The system may include a movable cover adapted to protecting at least part of the image sensor from contamination. The system may include a washing system adapted to clean at least part of the image sensor. The image sensor may be fixed or movable. The system may include a movable shutter adapted to shield at least part of the image sensor. The image sensor is part of a stand-alone, free-standing system with its own image processing system to evaluate the images.

In accordance with another aspect of the present invention, an electrode inspection apparatus for an electrochemical processing tool, is provided. The apparatus includes an image sensor and an image processor. The image sensor is adapted to be mounted on or adjacent to the electrochemical processing tool above a viewable electrode of the electrochemical processing tool. The image sensor is adapted to selectively obtain images of the viewable electrode. The image processor is communicably coupled to the image sensor so that the image processor may receive image signals from the image sensor. The image processor includes code to evaluate and process the image signals received from the image sensor.

In accordance with yet another aspect of the present invention, a method of visually inspecting electrodes is provided. This method includes the following steps described in this paragraph. The order of the steps may vary, may be sequential, may overlap, may be in parallel, and combinations thereof, if not otherwise stated. An image sensor is aimed at a viewable portion of an electrode on an electrochemical processing tool. An image of the electrode is obtained with the image sensor. The electrode image is evaluated to determine whether the electrode is damaged. The evaluating of the electrode image may be performed, at least in part, by an image processor. The image processor may calculate an index based on at least one characteristic of the electrode image. The at least one characteristic of the electrode image may be electrode brightness, electrode color, number of pits, size of pit, number of scratches, size of scratch, size of corrosion, or combinations thereof, for example. The image processor may calculate a difference between the calculated index and an index for a new electrode. The image processor may calculate a difference between the calculated index and a predetermined standard. The method may include shielding at least part of the image sensor during at least part of the time when the image sensor is not being used; and exposing at least part of the image sensor during use of the image sensor. The shielding may be performed by a movable shutter. The method may include directing a flow of air or gas past at least part of the image sensor to hinder contamination of the image sensor. The method may include removing contamination, if any, from at least part of the image sensor. The removing contamination may include rinsing at least part of the image sensor with deionized water.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 1:
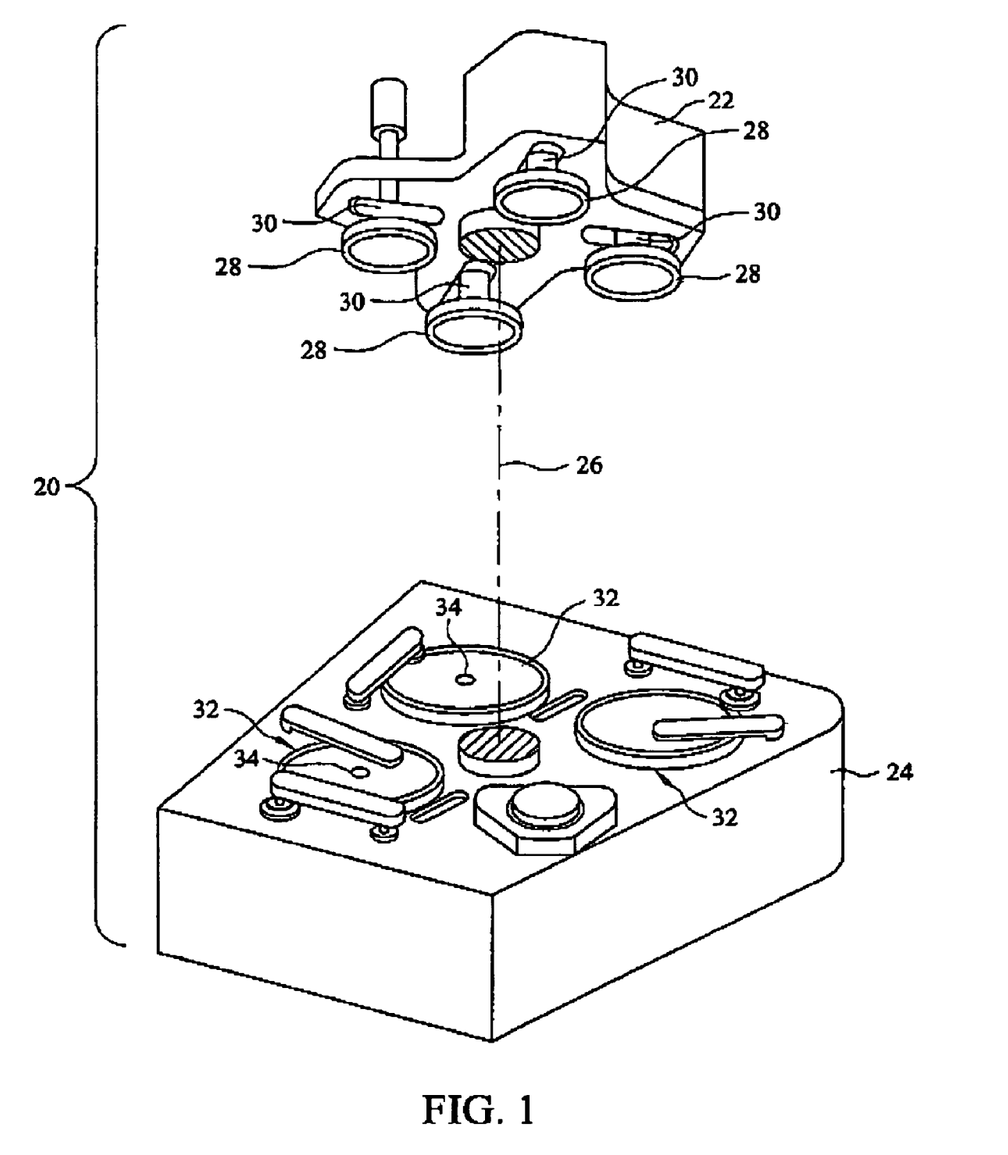
FIG. 1 is a multi-station electrochemical processing tool used in automated semiconductor processing.
Figure 2A:
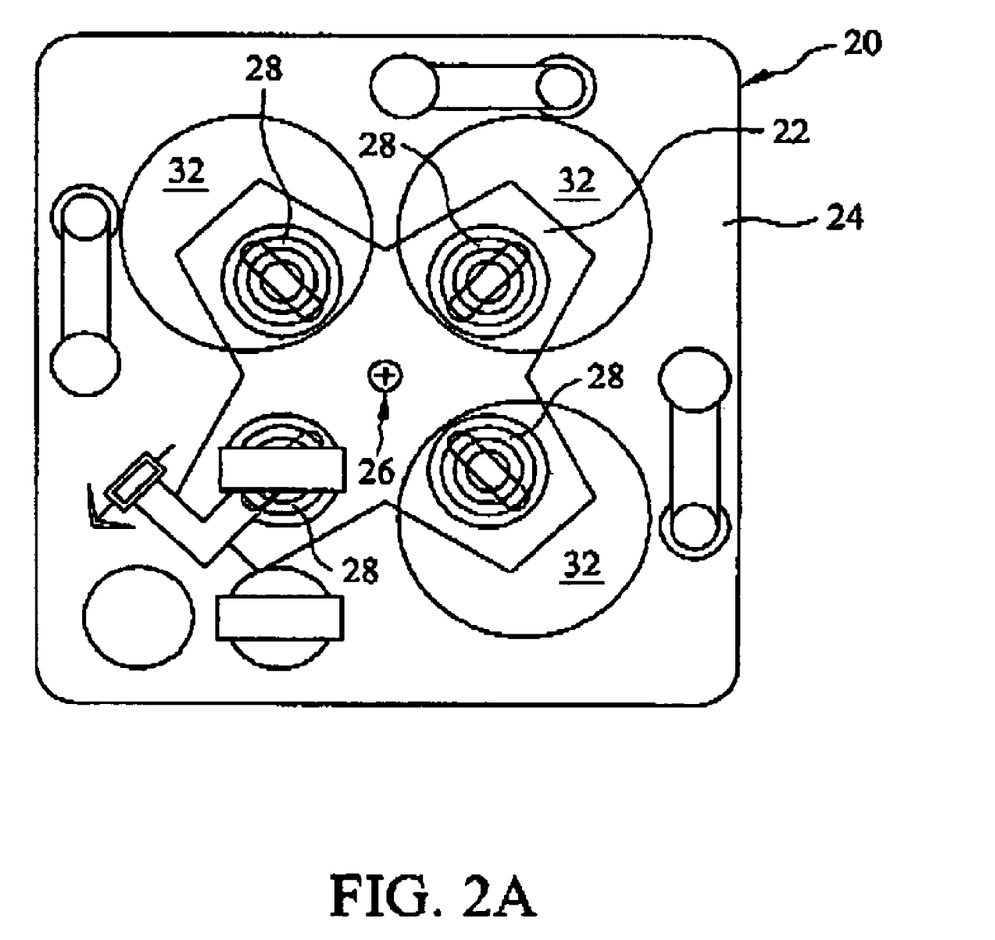
FIG. 2A is a top view of the tool of FIG. 1.
Figure 2B:
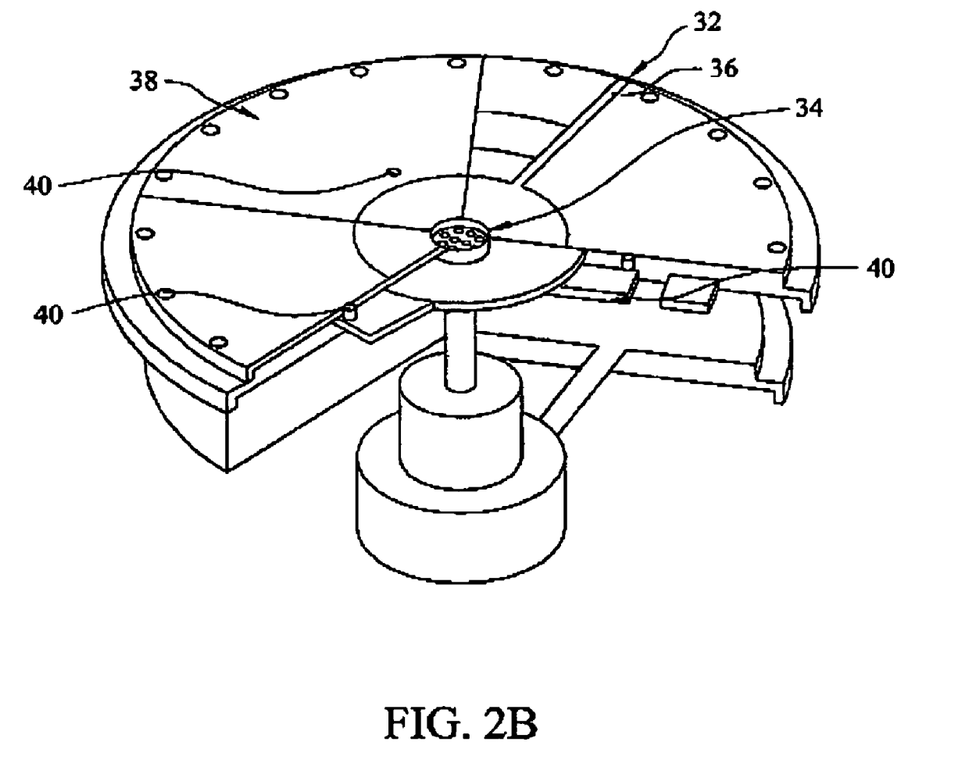
FIG. 2B is an enlarged cut-away view for one of the platens used for ECMP processing.
Figure 2C:
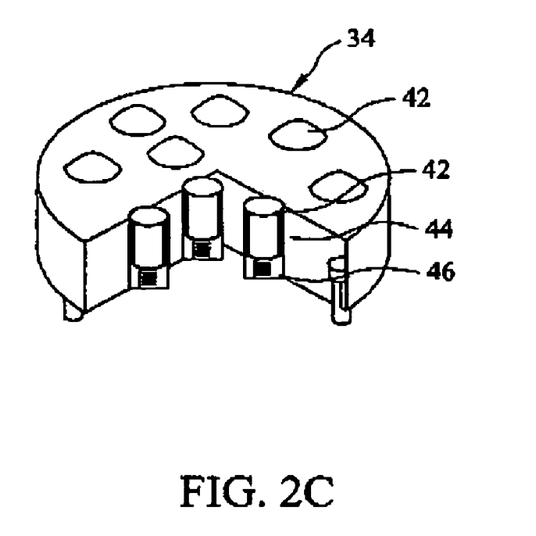
FIG. 2C is an enlarged cut-away view showing the central electrode of FIG. 2B.

Generally, an illustrative embodiment of the present invention provides an image sensor system for monitoring the condition of an electrode for electrochemical processing tools and a method of using the same. FIGS. 1-2C show an illustrative electrochemical processing tool 20 that may be used to perform ECP and/or ECMP while manufacturing integrated circuit chips. The tool 20 shown in FIG. 1 is a multi-station tool used in automated semiconductor processing, for example. An example of this illustrative tool 20 is the AMAT Reflexion e-CMP machine made by Applied Materials, Inc. The tool 20 has a transfer station, an ECMP station, and an ECP station, for example. A rotatable multi-head carousel 22 is positioned above the base 24 of the tool 20. The tool 20 of FIG. 1 is shown in a partially exploded view to illustrate portions of the multi-head carousel 22. The multi-head carousel 22 can rotate about a vertical axis 26 of the tool 20. The multi-head carousel 22 includes four carrier heads 28 used to hold and retain wafers during processing. Each carrier head 28 can move radially along a slot 30 and each carrier head 28 may rotate independently about its own axis.

FIG. 2A is a top view of the tool 20 of FIG. 1. The tool 20 has three platens 32. FIG. 2B is an enlarged cut-away view for one of the platens 32 used for ECMP processing. The platen 32 of FIG. 2B has a central electrode 34, which is an anode electrode, located at the center of the platen 32. A plate electrode 36 (e.g., cathode) is located partially about the central anode electrode 34 and is separated by a radial distance. An abrasive pad assembly 38 is located on the platen 32 and over the cathode electrode 36. Only a quarter section of the pad 38 is shown in FIG. 2B, with the remaining three quarters not being shown. The pad 38 preferably does not cover the central electrode 34 so that the wafer may physically contact the central electrode 34 during processing. The pad 38 is porous to allow electrolyte fluid to flow across and through the pad 38. The porous pad 38 will typically be a composite pad that is non-conductive. The platen 32 of FIG. 2B also includes Eddy current probes 40 used as thickness sensors during processing (e.g., to measure copper thickness during processing).

FIG. 2C is an enlarged cut-away view showing the central electrode 34 of FIG. 2B. The central electrode 34 of this illustrative tool is adapted to physically contact the wafer during the processing of the wafer. Referring to FIG. 2C, the central electrode 34 includes conductive members 42, which are often made of copper, for example, if the ECMP is adapted for removing copper (e.g., where the wafer has copper conductive lines). Each of these conductive members 42 is permitted to be pressed into its socket 44 by a flexible contact 46. The conductive members 42 make physical contact with the wafer during processing. In the example tool shown, the conductive members are generally rod shaped. Other shapes (not shown) of conductive members may be inspected using an embodiment of the present invention as well. The conductive members 42 are thus free to move and may be pressed into the socket 44 (due to the flexible contacts 46, e.g., spring members) to prevent damage to the wafer. When a conductive member 42 becomes deeply scratched or marred, the conductive member 42 may be prevented from moving within the socket 44 smoothly. Also when a conductive member 42 becomes corroded, the corrosion may prevent the conductive member from being pushed downward into the socket 44 to reduce stress placed upon the wafer. Corrosion on a conductive member 42 may also induce poor electrode contact to the wafer or inconsistent contact, which can affect the electrochemical processing greatly.

Because the central electrode 34 is not covered by the pad assembly 38, it may be visually inspected directly without disassembling the tool 20, for this illustrative tool. The surface of the electrode members 42 needs to be clean and smooth to provide good contact with the wafer. Poor contact may induce a large IR drop or an open circuit, which will impact process quality significantly. The electrode members 42 may be scratched, corroded, oxidized, burned, worn out, or combinations thereof, over time from usage. Under current operations, the central electrode 34 that contacts the wafer is checked visually by a person once per day, for example. However, if the electrode 34 becomes damaged at some point during that day, the production yield for that day may be impacted significantly. Thus, it would be more desirable to monitor and inspect the condition of the central electrode 34 more frequently, but without the need for a person to come to the tool 20 each time. These tools often run for many hours in an automated manner without the need for human interaction.

An illustrative embodiment of the present invention provides a system 50 and method to visually inspect and monitor the central electrode 34 more frequently and without the need for a person to physically come to the tool 20 to perform the inspection. Also, when a person comes to the tool 20, typically the processing must be stopped to allow the person to visually inspect the electrode. But with an illustrative embodiment of the present invention, the electrode 34 may be inspected during a process and/or between processes (e.g., as the multi-head carousel 22 moves past the central electrode 34).

Figure 3:
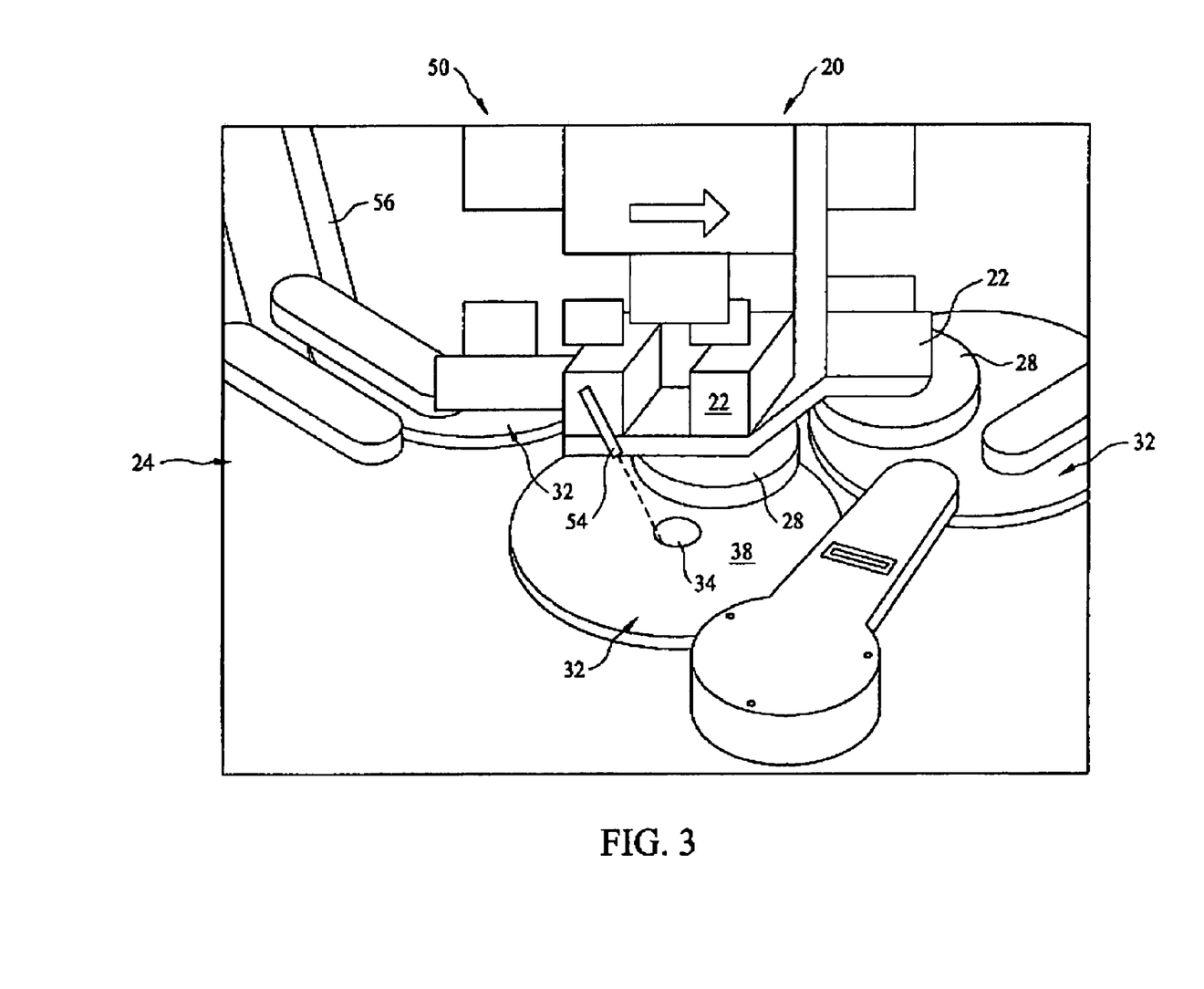
FIG. 3 illustrates a system in accordance with a first illustrative embodiment of the present invention.

FIG. 3 illustrates a system 50 in accordance with a first illustrative embodiment of the present invention. FIG. 3 is a perspective view of the system 50, which includes the same electrochemical processing tool 20 shown in FIGS. 1-2C, for example. In the first embodiment, an image sensor 54 is attached to the multi-head carousel 22, and is thus positioned above the platens 32. The image sensor 54 of the first embodiment is fixed relative to the carousel 22, but the carousel 22 rotates relative to the platens 32. The image sensor 54 is positioned so that it can capture an image of a viewable part of the central electrode 34 from above the platen. The image sensor 54 is aimed at the central electrode 34 when the multi-head carousel 22 is rotated to a certain position, as shown in FIG. 3, for example. The first embodiment may be implemented in other electrochemical processing tools as well. In another embodiment (not shown), the image sensor 54 may be movable relative to the carousel 22 while still being attached to the carousel 22.

Figure 4:
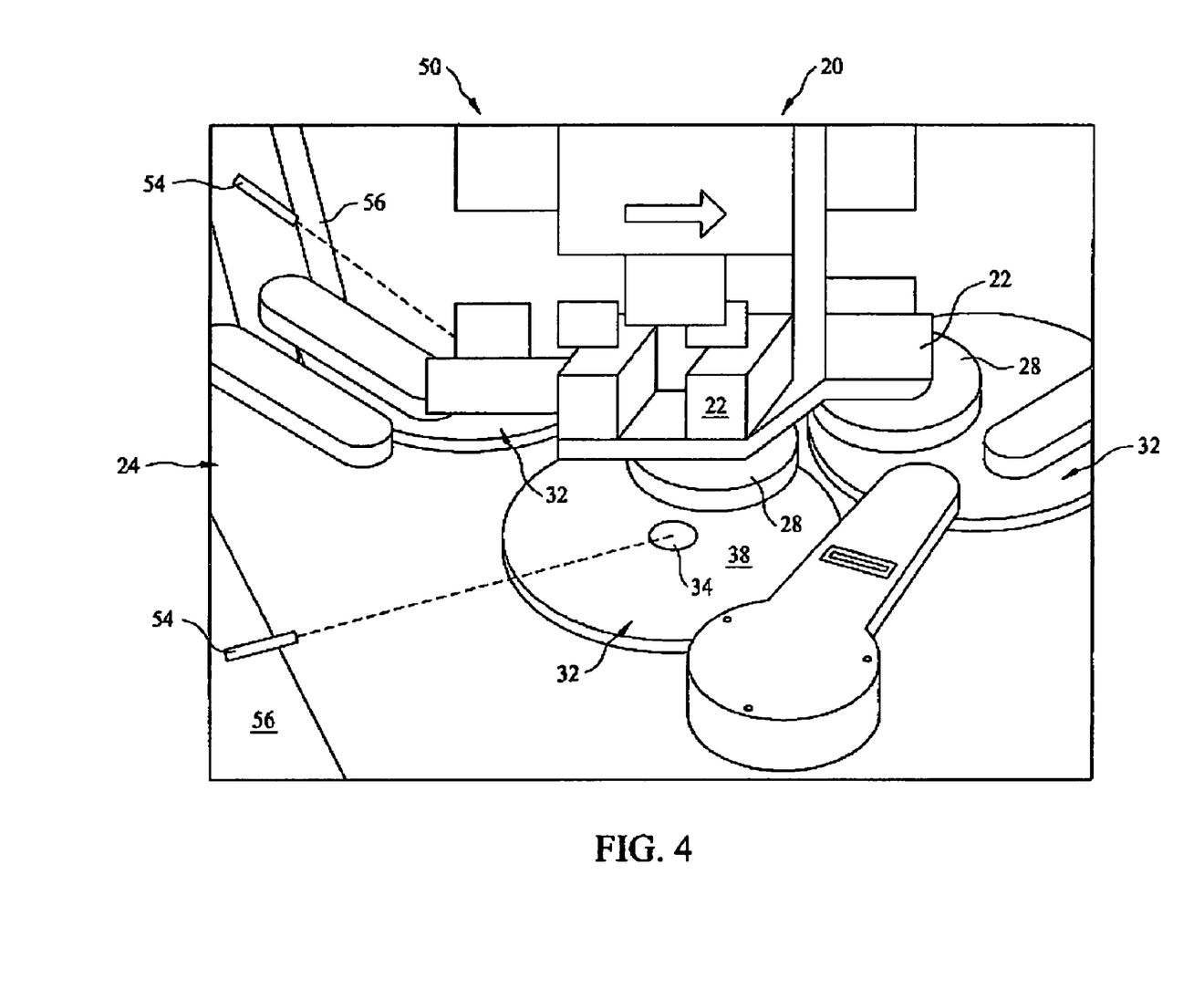
FIG. 4 illustrates a system in accordance with a second illustrative embodiment of the present invention.

FIG. 4 illustrates a system 50 in accordance with a second illustrative embodiment of the present invention. FIG. 4 is a perspective view of the system 50, which includes the same electrochemical processing tool 20 shown in FIGS. 1-3, for example. In the second embodiment, image sensors 54 are attached to a fixed structural frame 56 that supports at least part of the tool 20. In the second embodiment, each image sensor 54 is aimed at a central electrode 34, as shown in FIG. 4. The image sensors 54 are fixed relative to the frame 56 and are located above the platens 32. In other embodiments, one or more of the image sensors 54 may be movable relative to the frame 56 while still being attached to the frame 56. In yet another embodiment, an image sensor 54 of the system 50 may be freestanding (e.g., having its own stand or frame, which may be attached to the floor and/or a wall) or may be attached to another object located adjacent to the tool 20, such as a cabinet, a wall, or another tool, for example. It is also contemplated that an embodiment may have image sensors 54 attached to the carousel 22 and a non-movable object, such as the frame 56, to provide different view angles of the electrode 34. The image sensor system of an embodiment may be a stand-alone system, which may be fixed or portable, for example.

Figure 5:
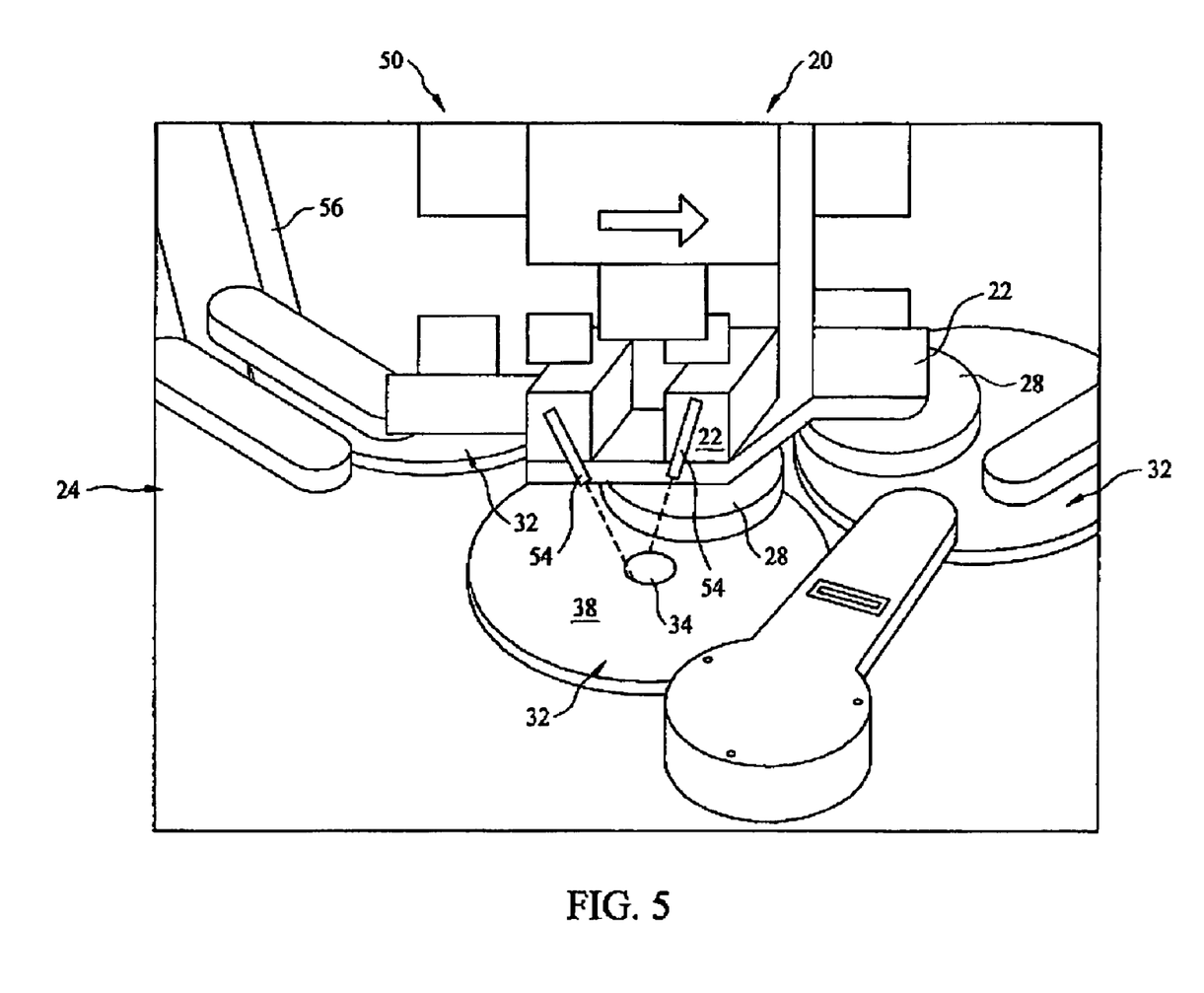
FIG. 5 illustrates a system in accordance with a third illustrative embodiment of the present invention.

FIG. 5 illustrates a system 50 in accordance with a third illustrative embodiment of the present invention. The third embodiment of FIG. 5 may be essentially the same as the first embodiment of FIG. 3, but with the addition of another image sensor 58 attached to the carousel 22. It may be desirable to take images of the electrode 34 from different angles. Also, having two image sensors 54 may provide faster imaging of all sides of the electrode 34. Furthermore, the second image sensor may act as a back up in case one of the sensors 54 gets contaminated, dirty, or is malfunctioning.

Figure 6:
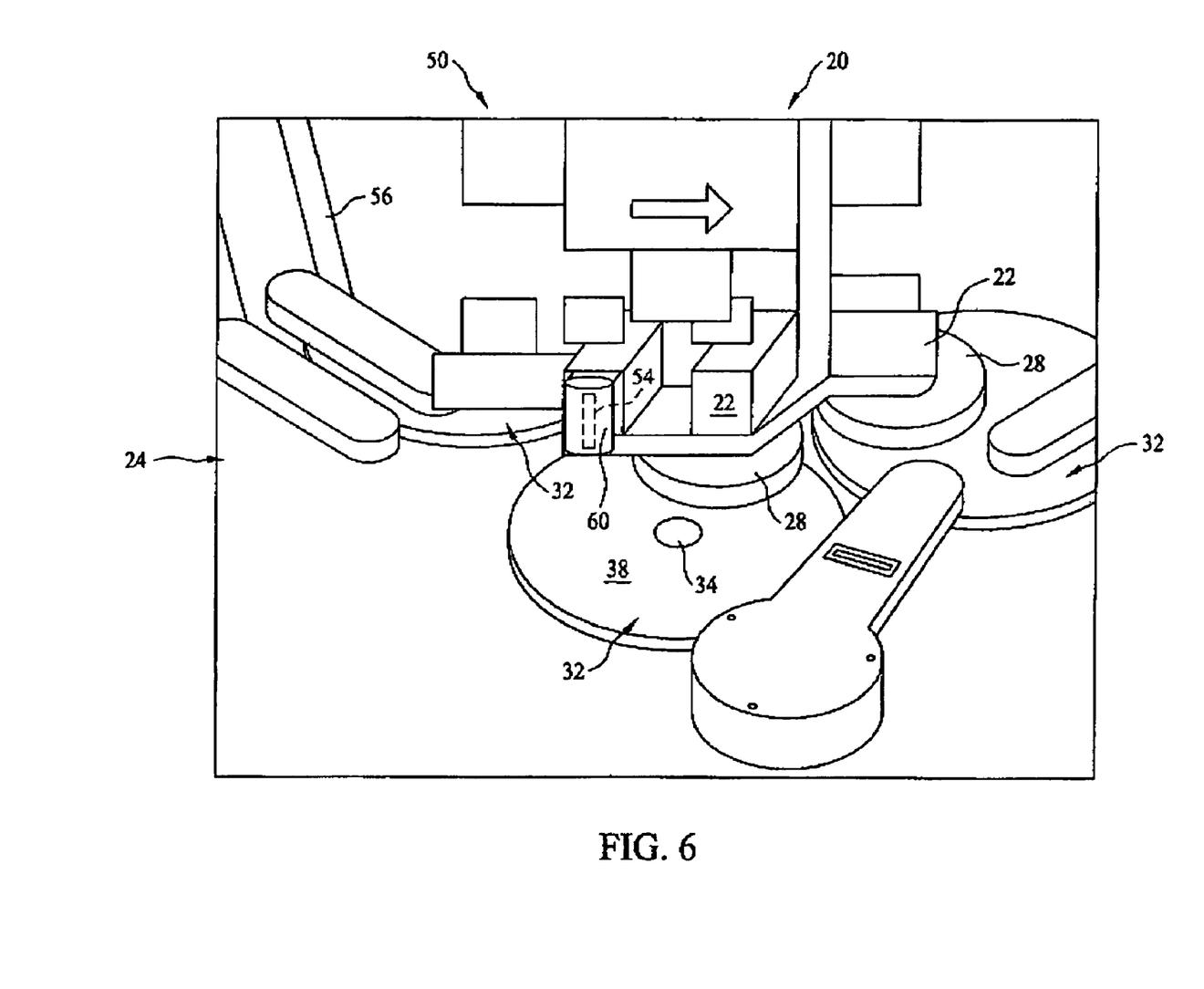
FIG. 6 illustrates a system in accordance with a fourth illustrative embodiment of the present invention.

FIG. 6 illustrates a system 50 in accordance with a fourth illustrative embodiment of the present invention. In the fourth embodiment, the image sensor 54 is attached to the carousel 22 above the platens 32, similar to the position of the image sensor in the first embodiment of FIG. 3. But, the fourth embodiment includes a movable cover 60 for protecting at least part of the image sensor 54 from being contaminated during processing of the wafer. For example, the movable cover 60 may be configured to rotate and uncover a lens portion of the image sensor 54 when the time comes for the image sensor 54 to be used. In the fourth embodiment of FIG. 6, the image sensor 54 is located inside the movable cover 60. The movable cover may have any suitable design that can adequately protect some part of the image sensor (e.g., the lens). Such a cover may be implemented in other embodiments of the present invention as well, such as the second and third embodiments, for example.

In another embodiment, the image sensor 54 may be attached to a movable robotic arm that moves to a position over the platen to view the electrode 34 as needed, as desired, or as programmed. In such case, the image sensor 54 may be moved away from the processing tool 20 to prevent contamination of the image sensor 54 and/or to keep the image sensor 54 out of the way during processing.

In yet another embodiment, a washing system (not shown) may be included in the system 50 to periodically clean at least part of the image sensor 54. Such a washing system may include a valve that controls the flow of a cleaning solution (e.g., deionized water) directed at the image sensor 54. An image sensor 54 of an embodiment may have a movable shutter (not shown) adapted to shield at least part of the image sensor 54 (e.g., a shutter over the lens). An image sensor 54 of an embodiment may be partially or completely covered by transparent material (not shown), such as glass or acrylic, to cover or shield the image sensor 54 from being contaminated or damaged. An image sensor 54 may be periodically washed (e.g., using deionized water and/or some other cleaning solution) to ensure that high quality images may be obtained. The image sensor 54 may be protected by a stream of air, some gas, or some gas mixture flowing over at least part of the image sensor 54 during processing to protect the image sensor from being contaminated. This may be referred to as an air curtain.

An image sensor 54 of an embodiment may incorporate any currently known or later developed image capturing hardware and/or software. For example, an image sensor 54 may include a charge-couple device (CCD) camera to capture digital images. As yet another example, among many, an image sensor 54 may include a CMOS camera. The image sensor 54 may be adapted to capture still images or video or both. The images captured by an embodiment of the present invention may be in an analog format or a digital format, for example.

An embodiment of the present invention may be applied to or incorporated into any electrochemical processing tool having a viewable electrode that may be visually inspected and monitored using an image sensor. Some example copper electroplating tools on which an embodiment may be implemented include (but are not limited to): AMAT electrochemical plating (ECP) machine made by Applied Materials, Inc., and NVLS ECP machine made by Novellus Systems, Inc., for example. Some example electro-polishing or electro-enhanced CMP tools on which an embodiment may be implemented include (but are not limited to) those available from Applied Materials, Inc., Novellus Systems, Inc., and Ebara Technologies, Inc., for example.

A system 50 of an embodiment may include an image processor that is communicably coupled to the image sensor(s) 54. This may be an image comparison system. The image processor may be used to receive and process image signals from an image sensor 54. The image sensor 54 may communicate such image signals to the image processor by any suitable form of communication, including (but not limited to): wireless, wired, optical, laser, fiber-optic cable, coaxial cable, microwave, infrared, and combinations thereof, for example.

The image processor may be a dedicated processor (custom designed or general running software) for the image sensor system. In such case, the image sensors and image processing may be performed independent of the electronics used to control and operate the electrochemical processing tool. Alternatively, the image processor may be an integral part of the tool's electronics and control system (e.g., using the same processor that controls the tool 20). The image processor may be communicably coupled to a control system for the electrochemical processing tool 20. In such case, the image processor may send a signal to stop the tool 20 automatically or, according to a program, when damage to the electrode is detected. In other embodiments, the image processor may simply provide a warning message to another system or to a system operator or to a system administrator. Also, the image processor may trigger an alarm system to notify another system or a person that a damage electrode is detected.

Preferably, the operation of an image sensor 54 for an embodiment is coordinated with other operations and processes being performed by the tool 20 to ensure the best use of the image sensor 54 and to obtain better images. In a preferred embodiment, images of the electrodes 34 may be taken when wafers are being changed during the processing, which typically takes a few seconds. Images of electrodes 34 may also be taken when a tool 20 is idle. In a preferred embodiment, an electrode 34 is visually inspected for every wafer processed. Otherwise, wafers processed between a last inspection and a current inspection where a damaged electrode is spotted may need to be sorted and analyzed. Under a current procedure (inspecting once a day), this may mean that hundreds of wafers would need sorting and testing. Inspecting an electrode 34 for every wafer processed may greatly improve the production yield by reducing the number damaged wafers processed. In some embodiments, the image sensor 54 may be obtaining random images even when the electrode 34 is not within view. In such case, the unneeded images may be deleted or removed automatically or manually. Preferably, the process of obtaining the images and evaluating the images is automated and performed by a computer algorithm.

The image processor of the system 50 preferably includes code to evaluate and process the image signals received from an image sensor 54. The image processor may include code or software that can determine whether an image of the electrode 34 reveals damage to the electrode 34 that exceeds some predetermined criteria. The predetermined criteria may include (but is not limited to): electrode brightness, electrode color, number of pits, size of pit, number of scratches, size of scratch, size of corrosion area, and combinations thereof, for example. The image processor may calculate an index based on at least one of these listed criteria or characteristics of the electrode image. In such case, the calculated index may be compared to a standard index or a threshold index. The image processor may calculate a difference between the calculated index and the standard index to track the change in damage and/or to determine if the difference should trigger an alarm, warning, and/or stop signal, for example. The calculated index may be compared to an index of the electrode when it was new or to a standard index of a new electrode, to calculate the difference in indexes. The first image of the electrode when it is new may be used as the standard for comparison by the image processor. As the electrode wears, it may become discolored, for example. If the electrode is oxidized, the oxidized portions may have a darker color or different color. These are detectable changes in an image. The image sensor may provide non-visible images of the electrode, such as infrared images for example. The image sensor may operate in a radiation scan-reflection mode.

An embodiment of the present invention may provide numerous advantages through its implementation and use in semiconductor manufacturing, including (but not necessarily limited to): ease of implementation on existing tools; inexpensive to implement on existing tools; embodiment may be implemented using off-the-shelf components; embodiment does not negatively impact or may not interfere with the performance and operation of an existing tool; easy and inexpensive to maintain; increased production yield; automated system requiring little or no human interaction; embodiment may prevent abnormal electrodes from damaging wafers; embodiment may be used to automatically stop a process to prevent damage to numerous wafers; embodiment may be an in-situ inspection process; embodiment may be an integrated or stand-alone system; embodiment may improve processing quality and product quality by maintaining quality electrodes for processing; embodiment may provide real-time images of electrode; or any combination thereof.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for use in manufacturing semiconductor devices, the system comprising:
    an electrochemical processing tool comprising an electrode located at a central region of a platen, the electrode being adapted for contacting a wafer workpiece during certain processing of the wafer workpiece using the tool, and at least part of the electrode being viewable from above the platen when the electrochemical processing tool is operably assembled; and
    an image sensor capable of capturing an image of the viewable part of the electrode, the image sensor being positioned above the platen, and the image sensor adapted to be aimed at the electrode when an image of the electrode is to be taken with the image sensor.

2. The system of claim 1, wherein the electrochemical processing tool comprises an electrochemical mechanical polishing tool, wherein the electrode is an anode electrode having a plurality of conductive members, and wherein the conductive members are adapted to make physical contact with the wafer workpiece when the electrode is used for processing the wafer workpiece.

3. The system of claim 2, wherein the image sensor is attached to a movable polishing head.

4. The system of claim 2, wherein the image sensor is attached to a fixed structural frame portion that supports at least part of the tool.

5. The system of claim 1, wherein the image sensor comprises a charged-coupled device (CCD) camera or a CMOS camera.

6. The system of claim 1, further comprising an image processor system.

7. The system of claim 6, wherein the image processor system comprises software adapted to determine whether an image of the electrode reveals damage to the electrode that exceeds predetermined criteria.

8. The system of claim 6, wherein the image processor system comprises software adapted to compare a latest image of the electrode to certain standards.

9. The system of claim 6, wherein the image sensor and the image processor system are integral parts of the electrochemical processing tool.

10. The system of claim 6, wherein the image sensor and the image processor system are parts of a stand-alone sensor system operable independent of the electrochemical processing tool.

11. The system of claim 1, wherein the image sensor is electrically connected to electronic devices of the electrochemical processing tool and wherein the image sensor is adapted to feed image signals into the electronic devices of the electrochemical processing tool.

12. The system of claim 1, wherein the electrochemical processing tool comprises an electrochemical plating tool.

13. The system of claim 1, further comprising a movable cover adapted to protect at least part of the image sensor from contamination.

14. The system of claim 1, further comprising a washing system adapted to clean at least part of the image sensor.

15. The system of claim 1, wherein the image sensor is fixed.

16. The system of claim 1, wherein the image sensor is movable.

17. The system of claim 1, further comprising a movable shutter adapted to shield at least part of the image sensor.

18. The system of claim 1, wherein the image sensor is part of a stand-alone, free-standing system with its own image processing system to evaluate the image.

19. An electrode inspection apparatus for an electrochemical processing tool, the apparatus comprising:
    an image sensor adapted to be mounted on or adjacent to the electrochemical processing tool above a viewable electrode of the electrochemical processing tool, and the image sensor being adapted to selectively obtain images of the viewable electrode;
    a platen comprising an opening, wherein the viewable electrode is exposed through the opening; and
    an image processor communicably coupled to the image sensor so that the image processor may receive image signals of the viewable electrode from the image sensor, and the image processor comprising code to evaluate and process the image signals received from the image sensor.

20. The electrode inspection apparatus of claim 19, wherein the image sensor comprises a charge-coupled device (CCD) camera or a CMOS camera.

* * * * *